(12) United States Patent
Kim

(10) Patent No.: US 9,548,125 B2
(45) Date of Patent: Jan. 17, 2017

(54) SEMICONDUCTOR DEVICE HAVING MULTI-LEVEL CELL AND METHOD OF READING THE SAME

(71) Applicant: SK hynix Inc., Icheon-si Gyeonggi-do (KR)

(72) Inventor: Byoung Young Kim, Suwon-si (KR)

(73) Assignee: SK Hynix Inc., Icheon-si (KR)

( * ) Notice: Subject to any disclaimer, the term of this patent is extended or adjusted under 35 U.S.C. 154(b) by 0 days.

(21) Appl. No.: 14/702,951

(22) Filed: May 4, 2015

(65) Prior Publication Data

US 2016/0172049 A1    Jun. 16, 2016

(30) Foreign Application Priority Data

Dec. 11, 2014    (KR) .......................... 10-2014-0178422

(51) Int. Cl.
| | |
|---|---|
| *G11C 16/26* | (2006.01) |
| *G11C 16/08* | (2006.01) |
| *G11C 8/06* | (2006.01) |
| *G11C 8/10* | (2006.01) |
| *G11C 16/10* | (2006.01) |
| *G11C 11/56* | (2006.01) |
| *G11C 16/04* | (2006.01) |

(52) U.S. Cl.
CPC .................. *G11C 16/26* (2013.01); *G11C 8/06* (2013.01); *G11C 8/10* (2013.01); *G11C 11/5642* (2013.01); *G11C 16/08* (2013.01); *G11C 11/5628* (2013.01); *G11C 16/0483* (2013.01); *G11C 16/10* (2013.01)

(58) Field of Classification Search
CPC ......... G11C 16/26; G11C 16/08; G11C 16/10; G11C 16/0483
USPC .......................... 365/185.12, 185.03, 185.17
See application file for complete search history.

(56) References Cited

U.S. PATENT DOCUMENTS

| | | | | |
|---|---|---|---|---|
| 2007/0047299 A1* | 3/2007 | Bovino | ............... | G11C 11/5628 365/185.03 |
| 2008/0209106 A1* | 8/2008 | Bennett | .................. | G11C 16/08 711/103 |
| 2011/0157999 A1* | 6/2011 | Yoon | ...................... | G11C 16/10 365/185.22 |

(Continued)

FOREIGN PATENT DOCUMENTS

| | | |
|---|---|---|
| KR | 1020090041157 A | 4/2009 |
| KR | 1020130060749 A | 6/2013 |

*Primary Examiner* — Alexander Sofocleous
*Assistant Examiner* — Alfredo Bermudez Lozada
(74) *Attorney, Agent, or Firm* — William Park & Associates Ltd.

(57) ABSTRACT

A semiconductor device and a method of operating the same are provided. The method includes determining whether a read operation on a selected page is a beginning read operation on the selected page; performing a least significant bit (LSB) read operation on the selected page when the read operation is the beginning read operation on the selected page according to a determination result, and performing a first sub-read operation on the selected page according to a result of the LSB read operation; and performing a second sub-read operation including the LSB read operation or a most significant bit (MSB) read operation on the selected page according to stored program state data when the read operation is not the beginning read operation on the selected page according to the determination result.

15 Claims, 6 Drawing Sheets

(56) References Cited

U.S. PATENT DOCUMENTS

2013/0135928 A1\* 5/2013 Lee ........................ G11C 16/06
365/185.03

\* cited by examiner

SEMICONDUCTOR DEVICE HAVING MULTI-LEVEL CELL AND METHOD OF READING THE SAME

CROSS-REFERENCE TO RELATED APPLICATION

The present application claims priority to Korean patent application number 10-2014-0178422 filed on Dec. 11, 2014, in the Korean Intellectual Property Office, the entire disclosure of which is incorporated by reference herein.

BACKGROUND

1. Technical Field

The invention relates to a semiconductor device and a method of operating the same. More specifically, the invention relates to a read operation of a semiconductor device.

2. Related Art

A single-level cell (SLC) in which one-bit data is stored in one memory cell has been used for a semiconductor device, but due to a large capacity of the semiconductor device, a multi-level cell (MLC) in which a plurality of bits of data are stored in one memory cell is being developed. Recently, a type of the multi-level cell is subdivided, a cell in which two-bit data is stored in one cell is referred to as a multi-level cell, a cell in which three-bit data is stored in one cell is referred to as a triple-level cell (TLC), and a cell in which four-bit data is stored in one cell is referred to as a quadruple-level cell (QLC).

As such, as the number of bits stored in one cell is increased, program and read operations are performed unlike those of the single-level cell. For example, the program operation on the most significant bit (MSB) (an MSB program operation) is performed after the program operation on the least significant bit (LSB) (an LSB program operation) is performed. The read operation is performed according to each program state after it is determined whether a selected page is a page on which the LSB program operation is performed or a page on which the MSB program operation is performed.

SUMMARY

An aspect of the invention provides a method of operating a semiconductor device, including determining whether a read operation on a selected page is a beginning read operation on the selected page. The method also includes performing a least significant bit (LSB) read operation on the selected page when the read operation is the beginning read operation on the selected page according to a determination result, and performing a first sub-read operation on the selected page according to a result of the LSB read operation. The method may also include performing a second sub-read operation including the LSB read operation or a most significant bit (MSB) read operation on the selected page according to stored program state data when the read operation is not the beginning read operation on the selected page according to the determination result.

An aspect of the invention provides a semiconductor device, including a plurality of memory blocks including normal memory cells in which normal data is stored, and flag cells in which program state data is stored. The semiconductor device also includes a peripheral circuit configured to store a first row address and the program state data of a selected page on which a read operation is performed among the plurality of memory blocks, and perform a read operation on the selected page. The semiconductor device also includes a control circuit configured to determine whether an input second row address is equal to the first row address, and control the peripheral circuit to perform the read operation on the selected page according to a determination result.

In an aspect of the invention, a semiconductor device includes a control circuit configured to determine whether a read operation is a beginning read operation of a selected page according to a comparison signal and to read the selected page. The semiconductor device also includes a peripheral circuit configured perform a least significant bit (LSB) read operation on the selected page during the beginning read operation. The peripheral circuit may also perform a first sub-read operation on the selected page according to the LSB read operation. Further, the peripheral circuit may also perform a second sub-read operation that includes the LSB read operation or a most significant bit (MSB) read operation on the selected page according to stored program state data when the read operation is not the beginning read operation.

DETAILED DESCRIPTION

Various embodiments of the invention will be described more fully hereinafter with reference to the accompanying figures. The invention may, however, be embodied in different forms and should not be construed as limited to the embodiments set forth herein. Various embodiments of the invention are described below in sufficient detail with reference to accompanying figures to enable those of ordinary skill in the art to embody and practice the invention. The invention is directed to a semiconductor device capable of reducing a read operation time by simplifying a read operation, and a method of operating the same.

Figure 1:
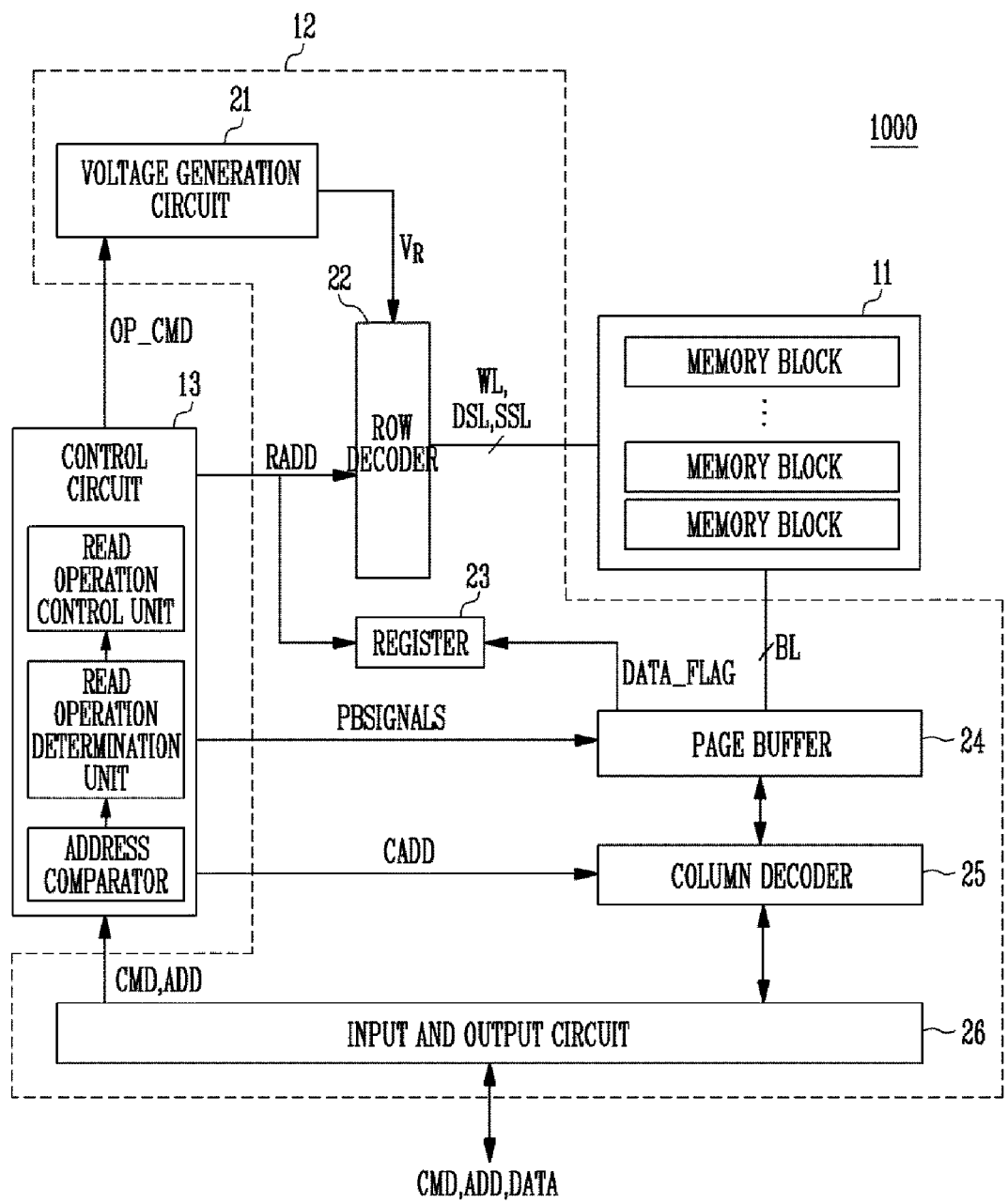
FIG. 1 is a diagram illustrating a semiconductor device according to an embodiment of the invention.

Referring to FIG. 1, a diagram illustrating a semiconductor device according to an embodiment of the invention is illustrated.

In FIG. 1, a semiconductor device 1000 may include a memory cell array 11 in which data is stored, a peripheral circuit 12 performing program, read, and erase operations of the memory cell array 11. The semiconductor device 1000 may also include a control circuit 13 controlling the peripheral circuit 12.

The memory cell array 11 may include a plurality of memory blocks, and each of the memory blocks may have the same structure. The memory block may include a plurality of cell strings. Further, the cell strings may have a two-dimensional structure or a three-dimensional structure. Normal data in which a user uses and flag data DATA_FLAG used in an operation of the semiconductor device may be stored in each of the memory blocks. For example, the flag data DATA_FLAG may include program state data of a page.

The peripheral circuit 12 may include a voltage generation circuit 21, a row decoder 22, a register 23, a page buffer 24, a column decoder 25, and an input and output circuit 26.

The voltage generation circuit 21 may generate operating voltages having various levels according to an operating command signal OP_CMD. The operating command signal OP_CMD may include a program command signal, a read command signal, and an erase command signal. For example, the voltage generation circuit 21 may generate read voltages VR having various levels in the read operation. The voltage generation circuit 21 may generate pass voltages, program voltages, and erase voltages having various levels besides the read voltages VR. FIG. 1 also illustrates PBSIGNALS.

The row decoder 22 may select one among the memory blocks included in the memory cell array 11 according to a row address RADD. The row decoder 22 may also transfer the operating voltages to word lines WL, drain select lines DSL, and source select lines SSL electrically coupled to the selected memory block. The row address RADD may include an address of the memory block on which the read operation is performed, and a page address of the selected memory block.

The register 23 may include a plurality of storage units for storing the row address RADD and the flag data DATA_FLAG. For example, the address and the page address of the memory block on which the read operation is performed and the flag data DATA_FLAG indicating a program state of a page on which the read operation is performed may be stored in the register 23.

The page buffer 24 may be electrically coupled to the memory blocks through bit lines BL, exchange data with the selected memory block in the program, read, and erase operations, and temporarily store the transferred data. For example, the page buffer 24 may temporarily store the normal data read from the normal memory cells, and also the flag data read from the flag cells in the read operation.

The column decoder 25 may exchange data with the page buffer 24 according to a column address CADD.

The input and output circuit 26 may transfer a command signal CMD and an address ADD transferred from the outside to the control circuit 13. The input and output circuit 26 may also transfer data DATA transferred from the outside to the column decoder 25, and output the data DATA transferred from the column decoder 25 to the outside or the control circuit 13.

The control circuit 13 may control the peripheral circuit 12 to perform the program, read, or erase operation according to the command signal CMD and the address ADD. In particular, the control circuit 13 may include an address comparator for comparing the input address and the stored address and outputting a comparison signal, a read operation determination unit for determining whether the read operation is a first read operation of a selected page in response to the comparison signal. The control circuit 13 may also include a read operation control unit for reading the selected page. For example, supposing that the input address is a first row address and the address stored in the register 23 is a second row address, the address comparator may output a first comparison signal when the first row address and the second row address are not the same. Further, the address comparator may output a second comparison signal when the first row address and the second row address are the same. The read operation determination unit may determine that the read operation is the first read operation of the selected page when the first comparison signal is received. Further, the read operation determination unit may determine that the read operation is not the first read operation of the selected page when the second comparison signal is received, and transfer the determination result to the read operation control unit. The read operation control unit may control the peripheral circuit to read the selected page using a predetermined algorithm according to whether the read operation is the first read operation of the selected page or not.

Figure 2:
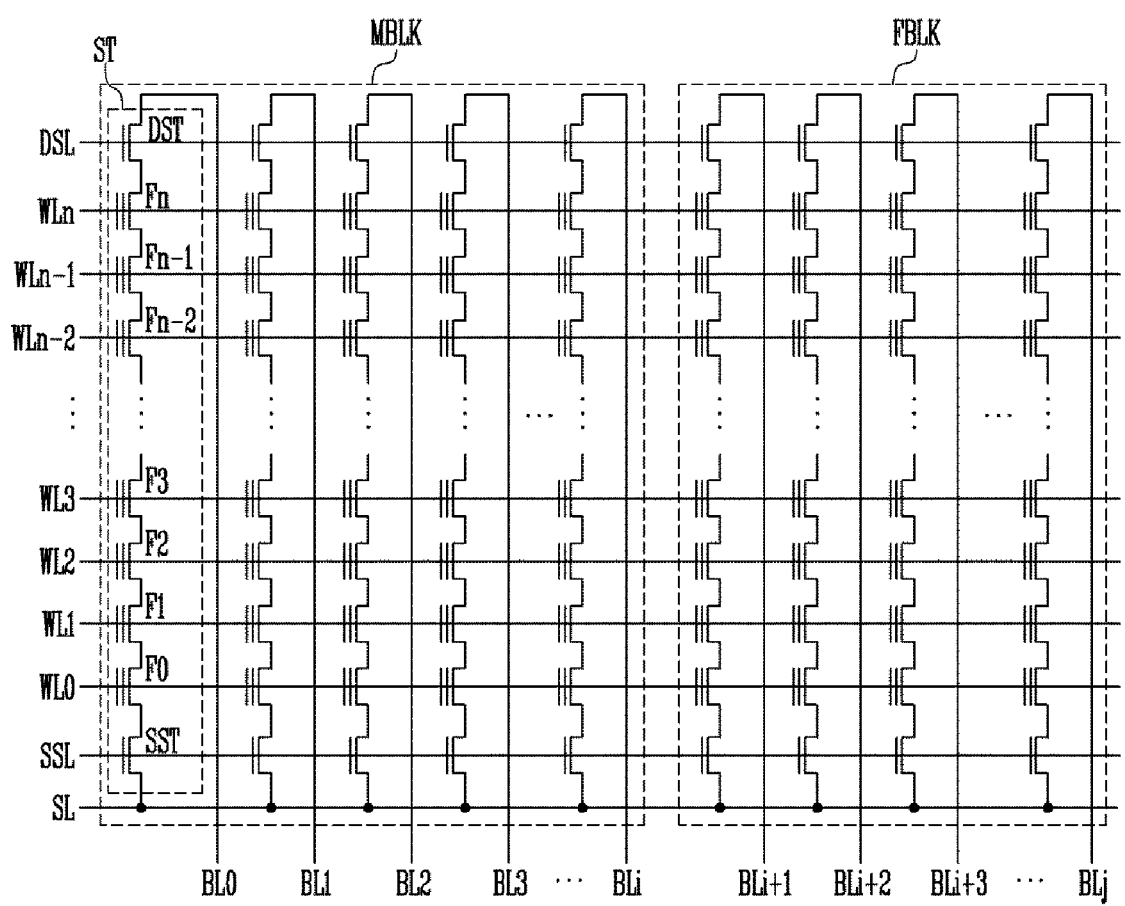
FIG. 2 is a detailed diagram illustrating a memory block of FIG. 1.

Referring to FIG. 2, a detailed diagram illustrating a memory block of FIG. 1 is illustrated.

In FIG. 2, the memory block may include a main block MBLK and a flag block FBLK. The main block MBLK and the flag block FBLK may have a difference in a type of data which is stored, and may have the same structure. For example, normal data in which a user uses may be stored in normal memory cells of the main block MBLK, and flag data used in the semiconductor device may be stored in flag cells of the flag block FBLK. For example, the flag data may include program state data of each page, and more particularly, include LSB or MSB program completion data.

In the memory block, the cell strings ST may be electrically coupled between bit lines BL0 to BLj and a source line SL, and be horizontally arranged on a semiconductor substrate. The cell strings ST may include source select transistors SST, a plurality of memory cells F0 to Fn, and drain select transistors DST. The source select transistors SST may be electrically coupled between the source line SL and the memory cells F0. Further, the drain select transistors DST may be electrically coupled between the bit lines BL0 to BLj and the memory cells Fn. Gates of the source select transistors SST may be electrically coupled to a source select line SSL, gates of the memory cells F0 to Fn may be electrically coupled to word lines WL0 to WLn, and gates of the drain select transistors DST may be electrically coupled to drain select lines DSL. A group of the memory cells electrically coupled to the same word line may be referred to as a page, and the read operation may be performed in units of pages.

Figure 3:
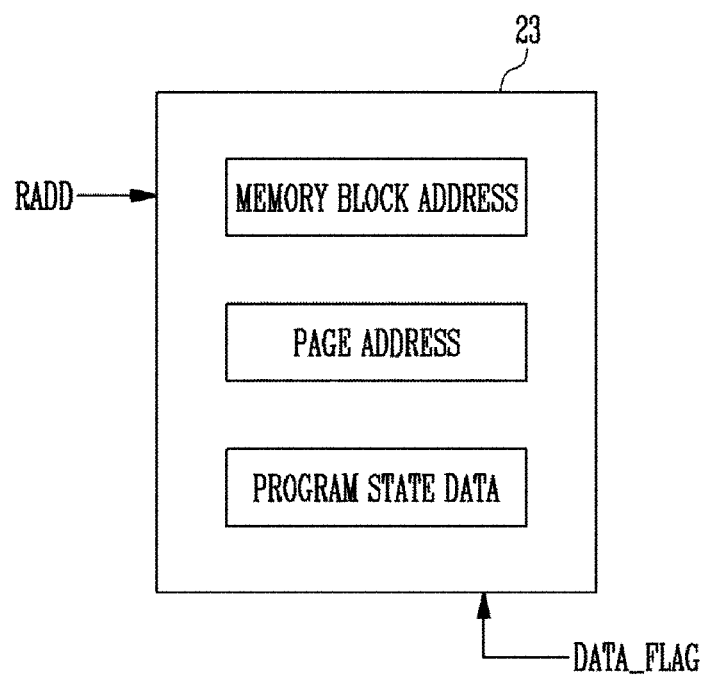
FIG. 3 is a detailed diagram illustrating a register of FIG. 1.

Referring to FIG. 3, a detailed diagram illustrating a register of FIG. 1 is illustrated.

In FIG. 3, the register 23 may include a plurality of storage units. For example, the register 23 may include first and second storage units in which the row address RADD is stored. The register 23 may also include a third storage unit in which the flag data DATA_FLAG including the program state data of the page is stored. The row address RADD may include a memory block address and a page address. The memory block address may be stored in the first storage unit, and the page address may be stored in the second storage unit. More specifically, the memory block address of a selected page on which the read operation is performed may be stored in the first storage unit. The page address may be stored in the second storage unit. Further, the program state data of the selected page may be stored in the third storage unit. Each of the first to third storage units may include a plurality of sub-storage units. For example, the plurality of memory block addresses in which the read operation is completed may be stored in the first storage unit. In addition, the memory block address input in the read operation may be temporarily stored in the first storage unit. The plurality of page addresses in which the read operation is completed may be also stored in the second storage unit. Further, the page address input in the read operation may be temporarily stored in the second storage unit. The program state data of the pages in which the read operation is completed may be also stored in the third storage unit. In addition, the program state data of the selected page read in the read operation may be temporarily stored in the third storage unit. The memory block address, the page address, and the program state data stored in the first to third storage units may be mapped to each other. The memory block address, the page address, and the program state address in which a corresponding page is included may be mapped as one group with respect to each page on which the read operation is initially performed.

Figure 4:
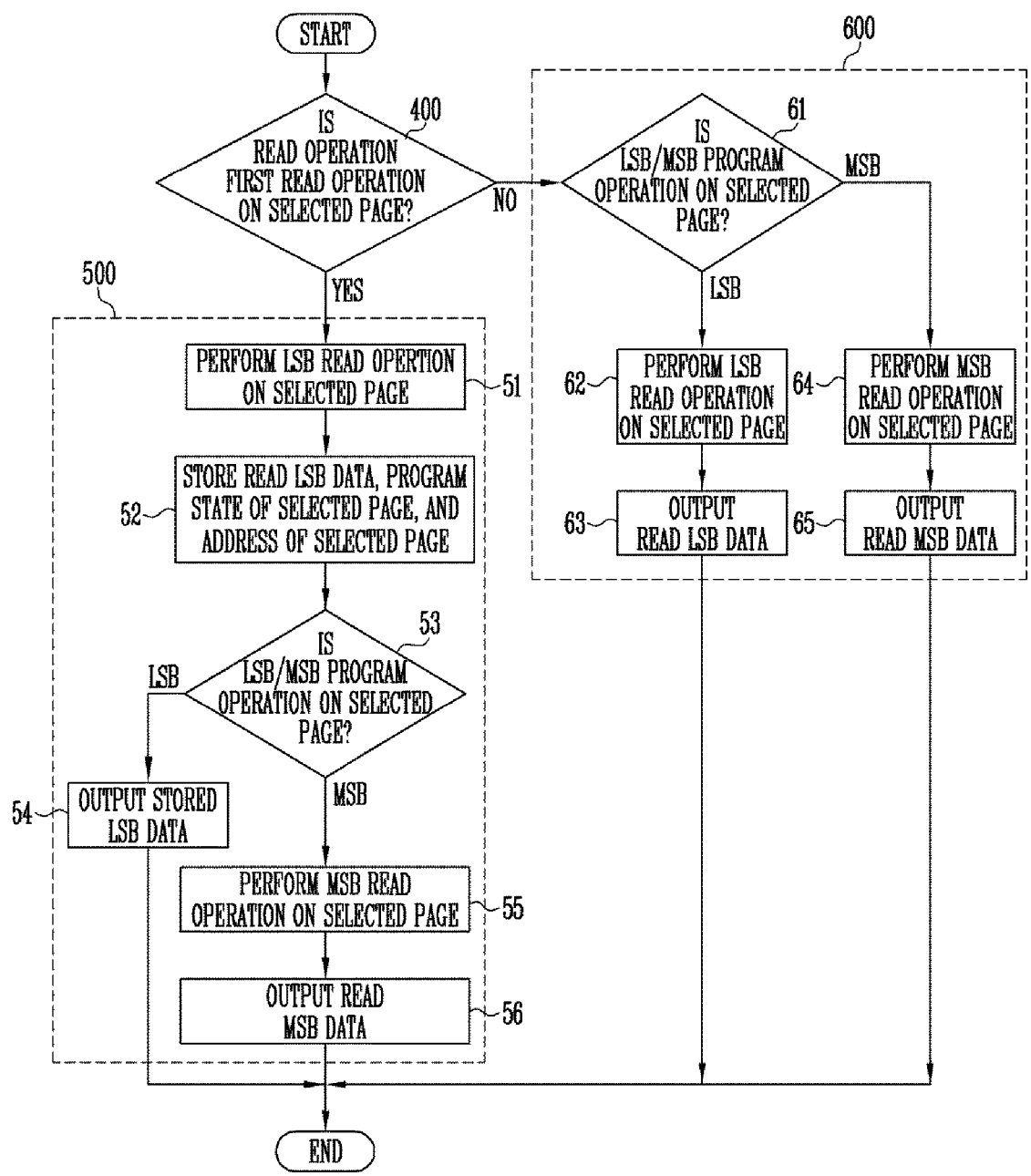
FIG. 4 is a flowchart for describing a read operation according to an embodiment of the invention.

Referring to FIG. 4, a flowchart for describing a read operation according to an embodiment of the invention is described.

In FIG. 4, when a read command signal is received to the control circuit (13 of FIG. 1), the control circuit 13 may control the peripheral circuit (12 of FIG. 1) to perform the read operation on the selected page by classifying into the read operation which is initially performed (operation 500) and the read operation which is not initially performed (operation 600) after determining whether the read operation on the selected page is initially performed (operation 400). For convenience of explanation, the read operation which is initially performed (the operation 500) may be referred to as a first sub-read operation. In addition, the read operation which is not initially performed (the operation 600) may be referred to as a second sub-read operation.

The read operation will be described in detail.

When the read operation is started, it may be determined whether the read operation on the selected page is the first read operation (the operation 400). It may be determined whether the read operation is the first read operation on the selected page or has been previously performed. For this determination, the address comparator of the control circuit 13 may compare the input row address RADD and the address stored in the first and second storage units of the register (23 of FIG. 2). Next, the read operation determination unit of the control circuit 13 may determine whether to perform the first or second sub-read operation (the operation 500 or 600) according to a comparison result of the address comparator. More specifically, the address comparator may compare the input row address RADD and the address stored in the first and second storage units of the register (23 of FIG. 2). The address comparator may compare the memory block address included in the row address RADD and the address stored in the first storage unit of the register 23. When there is no address which is equal to the input memory block address among the memory block addresses stored in the first storage unit, the address comparator may output a first comparison signal. Further, when there is an address which is equal to the input memory block address, the address comparator may output a second comparison signal. The read operation determination unit may transfer a first operation signal to the read operation control unit so that the first sub-read operation (the operation 500) is performed when the first comparison signal is received. In addition, the read operation determination unit may transfer a second operation signal to the read operation control unit so that the second sub-read operation (the operation 600) is performed when the second comparison signal is received. Moreover, when the first or second comparison signal is received to the read operation determination unit, the read operation determination unit may be configured to output an operation signal so that the first or second sub-read operation on the selected page is performed on the second row address.

The first sub-read operation (the operation 500) will be described in detail.

When it is determined that the read operation is the first read operation on the selected page, the read operation control unit of the control circuit 13 may control the peripheral circuit 12 to perform the first sub-read operation (operation 500) as follows.

When the first sub-read operation (operation 500) is started, an LSB read operation (operation 51) on the selected page may be performed. The LSB read operation (the operation 51) may be performed on every cell of the selected page included in the selected memory block according to the input row address RADD. The LSB data read from the selected page may include the normal data read from the memory cells and the flag data DATA_FLAG read from the flag cells. The flag data DATA_FLAG may include the program state data. Next, the read LSB data, the program state data of the selected page, and the address (the memory block address and the page address) of the selected page may be stored in the storage unit, respectively (operation 52). Further, it may be determined whether the selected page is a page on which an LSB program operation is performed or a page on which an MSB program operation is performed (operation 53). For this, the read operation control unit may determine whether the selected page is the page on which the LSB program operation is performed or the page on which the MSB program operation is performed according to the program state data included in the read LSB data. In the operation 53, when it is determined that the selected page is the page on which the LSB program operation is performed (LSB), the LSB data stored in the operation 52 may be output (operation 54). Further, the read operation on the selected page may be ended. In the operation 53, when it is determined that the selected page is the page on which the MSB program operation is performed (MSB), an MSB read operation on the selected page may be performed (operation 55). In addition, the read operation on the selected page may be ended after the read MSB data is output (operation 56).

When it is determined that the read operation is not the first read operation on the selected page, the read operation control unit of the control circuit 13 may control the peripheral circuit 12 so that the second sub-read operation (the operation 600) is performed as follows.

The second sub-read operation (the operation 600) will be described in detail.

When the second sub-read operation (the operation 600) is started, the control circuit 13 may determine whether the selected page is the page on which the LSB program operation is performed or the page on which the MSB program operation is performed (operation 61). The read operation control unit may determine whether the LSB program operation is performed on the selected page or the MSB program operation is performed on the selected page according to the program state data stored in the third storage unit of the register (23 of FIG. 2) instead of reading the selected page. When it is determined that the selected page is the page on which the LSB program operation is performed (LSB), the LSB read operation on the selected page may be performed (operation 62). In addition, the read LSB data may be output (operation 63). When it is determined that the selected page is the page on which the MSB program operation is performed (MSB), the MSB read operation on the selected page may be performed (operation 64). Further, the read MSB data may be output (operation 65). When the LSB or MSB data of the selected page is output, the read operation on the selected page may be completed.

As described above, the program state of the selected page may be rapidly determined according to the program state data stored in the previous read operation on the selected page. In addition, accordingly, since the LSB or MSB read operation is performed, the invention may have a smaller read operation time than a normal read operation in which it is determined whether each of the LSB or MSB program operation is performed in the LSB and MSB read operations.

Figure 5:
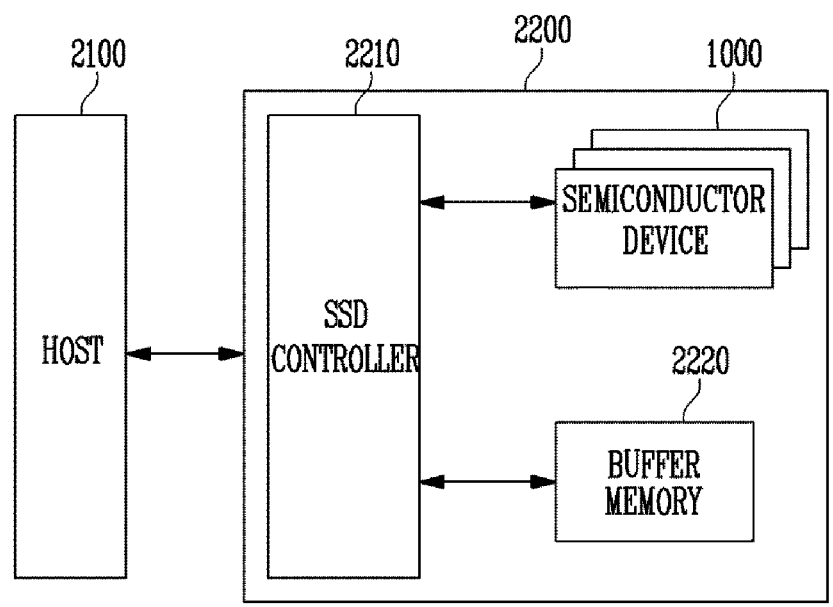
FIG. 5 is a block diagram illustrating a solid state drive including a semiconductor device according to an embodiment of the invention.

Referring to FIG. 5, a block diagram illustrating a solid state drive including a semiconductor device according to an embodiment of the invention is described.

In FIG. 5, a drive device 2000 may include a host 2100 and a solid state drive (SSD) 2200. The SSD 2200 may include an SSD controller 2210, a buffer memory 2220, and a semiconductor device 1000.

The SSD controller 2210 may provide a physical connection between the host 2100 and the SSD 2200. The SSD controller 2210 may provide an interface with the SSD 2200 corresponding to a bus format of the host 2100. In particular, the SSD controller 2210 may decode a command provided from the host 2100. The SSD controller 2210 may access the semiconductor device 1000 according to the decoded result. The bus format of the host 2100 may include a Universal Serial Bus (USB) protocol, a Small Computer System Interface (SCSI) protocol, a Peripheral Component Interconnect (PCI)-Express (PCI-E) protocol, an Advanced Technology Attachment (ATA) protocol, a Parallel ATA (PATA) protocol, a Serial ATA (SATA) protocol, a Serial Attached SCSI (SAS) protocol, etc.

Program data provided from the host 2100 or data read from the semiconductor device 1000 may be temporarily stored in the buffer memory 2220. When data present in the semiconductor device 1000 is cached in a read request of the host 2100, the buffer memory 2220 may support a cache function of directly providing the cached data to the host 2100. Generally, a data transmission speed by the bus format (for example, SATA or SAS) of the host 2100 may be greater than that of a memory channel of the SSD 2200. When an interface speed of the host 2100 is greater than the data transmission speed of the memory channel of the SSD 2200, performance degradation generated due to a speed difference may be minimized by providing the buffer memory 2220 having a large capacity. The buffer memory 2220 may be provided as a synchronous DRAM (SDRAM) to provide a sufficient buffering in the SSD 2200 used as an auxiliary storage device having a large capacity.

The semiconductor device 1000 may be provided as a storage medium of the SSD 2200. For example, the semiconductor device 1000 may be provided as a non-volatile memory device having a large capacity as described above with reference to FIG. 1, and may be provided as a NAND-type flash memory among the non-volatile memories.

Figure 6:
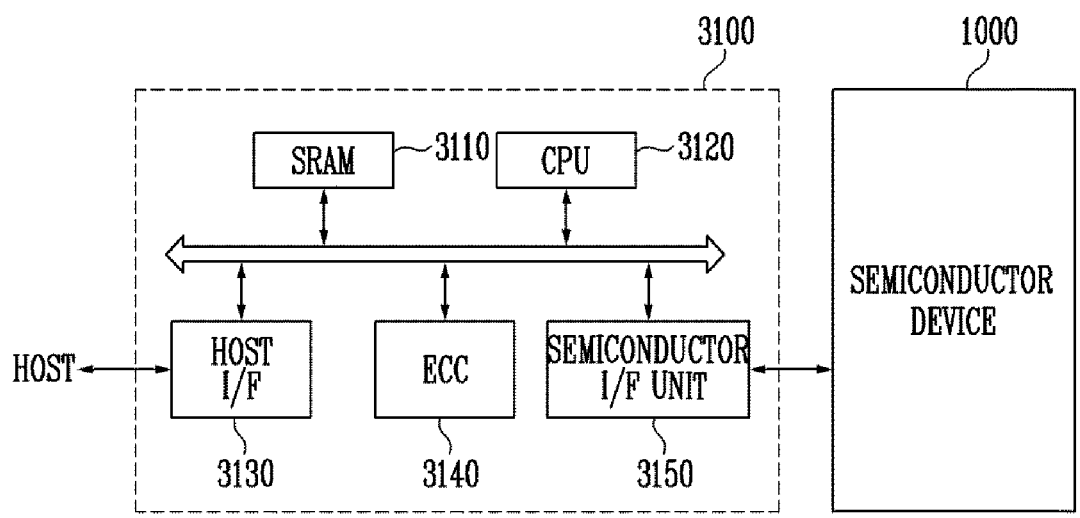
FIG. 6 is a block diagram illustrating a memory system including a semiconductor device according to an embodiment of the invention.

Referring to FIG. 6, a block diagram illustrating a memory system including a semiconductor device according to an embodiment of the invention is illustrated.

In FIG. 6, a memory system 3000 according to an embodiment of the invention may include a memory controller 3100 and a semiconductor device 1000.

Since the semiconductor device 1000 may substantially have the same configuration as the semiconductor device of FIG. 1, detailed description will therefore be omitted.

The memory controller 3100 may be configured to control the semiconductor device 1000. An SRAM 3110 may be used as an operating memory of a central processing unit (CPU) 3120. A host interface (I/F) unit 3130 may have a data exchange protocol of a host electrically coupled to the memory system 3000. An error correction circuit (ECC) 3140 included in the memory controller 3100 may detect and correct an error included in data read from the semiconductor device 1000. A semiconductor interface (I/F) unit 3150 may perform an interface with the semiconductor device 1000. The CPU 3120 may perform a control operation for data exchange of the memory controller 3100. Further, although not shown in FIG. 6, the memory system 3000 may further include a read only memory (ROM) for storing code data for an interface with the host.

The memory system 3000 according to an embodiment of the invention may be provided as one among a computer, an ultra mobile personal computer (UMPC), a workstation, a net-book, a personal digital assistant (PDA), a portable computer, a web tablet, a wireless phone, a mobile phone, a smart phone, a digital camera, a digital audio recorder, a digital audio player, a digital picture recorder, a digital picture player, a digital video recorder, a digital video player, a device for wirelessly transmitting and receiving information, and various electronic devices configuring a home network.

Figure 7:
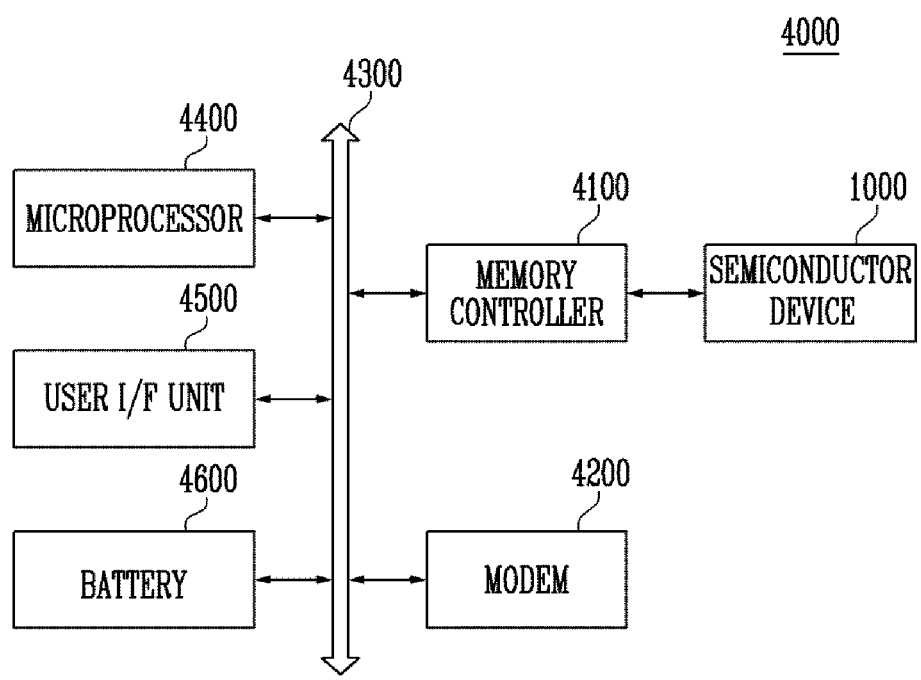
FIG. 7 is a schematic diagram illustrating a computing system including a semiconductor device according to an embodiment of the invention.

Referring to FIG. 7, a schematic diagram illustrating a computing system including a semiconductor device according to an embodiment of the invention is illustrated.

In FIG. 7, a computing system 4000 according to an embodiment of the invention may include a semiconductor device 1000, a memory controller 4100, a modem 4200, a microprocessor 4400, and a user interface (I/F) unit 4500 electrically coupled to a bus 4300. When the computing system 4000 is a mobile device, a battery 4600 for supplying an operating voltage of the computing system 4000 may be further included. Although not shown, the computing system 4000 according to an embodiment of the invention may further include an application chipset, a camera image processor (CIS), a mobile DRAM, etc.

Since the semiconductor device 1000 may substantially have the same configuration as the semiconductor device of FIG. 1, detailed description thereof will be omitted as a result.

The memory controller 4100 and the semiconductor device 1000 may configure the SSD.

The semiconductor device 1000 and the memory controller 4100 may be mounted as various types of packages. For example, the semiconductor device 1000 and the memory controller 4100 may be packaged and mounted in a manner such as a package on package (PoP), a ball grid array (BGA), a chip scale package (CSP), a plastic leaded chip carrier (PLCC), a plastic dual in-line package (PDIP), a die in waffle pack, a die in wafer form, a chip on board (COB), a ceramic dual in-line package (CERDIP), a plastic metric quad flat package (MQFP), a thin quad flat package (TQFP), a small outline integrated circuit (SOIC), a shrink small outline package (SSOP), a thin small outline package (TSOP), a system in package (SIP), a multi chip package (MCP), a wafer-level fabricated package (WFP), a wafer-level processed stack package (WSP), or the like.

The invention can reduce the read operation time by simplifying the read operation, and improve performance of the semiconductor device.

The technical spirit of the invention described above has been described with reference to various embodiments in detail, but it should be noted that the embodiments are used for the description and are not for purposes of limitation. Therefore, it will be understood by those of ordinary skill in the art that various changes in form and details may be made without departing from the spirit and scope of the invention as defined by the following claims.

What is claimed is:

1. A method of operating a semiconductor device, comprising:
   receiving a row address;
   determining whether there is a matching row address including a memory block address and a page address from among one or more row addresses including memory block addresses and page addresses stored in a register that is identical to the received row address by comparing the received row address with each of the one or more stored row addresses;
   if there is no matching row address, performing a first sub-read operation on a page corresponding to the received address, the first sub-read operation comprising reading LSB data and program state data programmed in the page and storing the received row address and the program state data in the register; and
   if there is the matching row address, performing a second sub-read operation on the page according to the program state data stored in the register,
   wherein, if the program state data stored in the register during the first sub-read operation indicates that an LSB program operation is performed on the selected page, the second sub-read operation comprises reading the LSB data read during the first sub-read operation, and
   if the program state data stored during the first sub-read operation indicates that an MSB program operation is performed on the selected page, the second sub-read operation comprises an MSB read operation on the selected page.

2. The method of operating the semiconductor device of claim 1, wherein the first sub-read operation comprises:
   performing the LSB read operation on the page;
   storing the received row address and read LSB data of the page; and
   outputting the stored LSB data when the program state data indicates that the LSB program operation is performed on the page, and outputting MSB data read by performing the MSB read operation on the page when the program state data indicates that the MSB program operation is performed on the page.

3. The method of operating the semiconductor device of claim 2, wherein, in the LSB read operation, the program state data is read from flag cells of the selected page.

4. The method of operating the semiconductor device of claim 3, wherein the first sub-read operation comprises determining the program state of the page according to the program state data read from the flag cells.

5. The method of operating the semiconductor device of claim 1, wherein the second sub-read operation comprises:
   determining the program state of the page; and
   outputting LSB data read by performing the LSB read operation on the page when the page is a page on which an LSB program operation is performed, and outputting MSB data read by performing the MSB read operation on the page when the page is a page on which an MSB program operation is performed.

6. A semiconductor device, comprising:
   a plurality of memory blocks including a plurality of pages, each of the plurality of pages including normal memory cells in which normal data is stored, and flag cells in which program state data is stored;
   a peripheral circuit configured to perform a read operation including a first sub-read operation and a second sub-read operation on the plurality of pages, and store a first row address including a memory block address and a page address and the program state data corresponding to a selected page among the plurality of pages; and
   a control circuit configured to determine whether the read operation on the selected page is a beginning read operation by comparing an second row address including the memory block address and the page address input from an external device with the first row address stored in the peripheral circuit, and control the peripheral circuit to perform one of the first sub-read operation and the second sub-read operation on the selected page according to a result of the determining,
   wherein, when the result of the determining indicates that the read operation on the selected page is not the beginning read operation, the peripheral circuit performs the second sub-read operation on the selected page based on the program state data stored during the first sub-read operation,
   if the program state data indicates that an LSB program operation is performed on the selected page, the second sub-read operation comprises an LSB read operation on the selected page, and
   if the program state data indicates that an MSB program operation is performed on the selected page, the second sub-read operation comprises an MSB read operation on the selected page.

7. The semiconductor device of claim 6, wherein the peripheral circuit includes:
   a voltage generation circuit configured to generate operating voltages having various levels;
   a row decoder configured to select one among the plurality of memory blocks in response to the second row address, and transfer the operating voltages to the selected memory block;
   a register configured to store the first row address and the program state data of the selected page;
   a page buffer configured to temporarily store the normal data and the program state data read from the selected page in the read operation; and
   a column decoder configured to exchange data with the page buffer in response to a column address.

8. The semiconductor device of claim 6, wherein the control circuit comprises:
   an address comparator configured to compare the first row address and the second row address, and output a first comparison signal or a second comparison signal;
   a read operation determination unit configured to determine whether the read operation on the selected page is an operation initially performed in response to the first or second comparison signal, and output an operation signal; and
   a read operation control unit configured to control the peripheral circuit to perform a first sub-read operation or a second sub-read operation on the selected page in response to the operation signal.

9. The semiconductor device of claim 8, wherein the address comparator compares the first row address and the second row address, outputs the first comparison signal when the first row address and the second row address are not identical to each other, and outputs the second comparison signal when the first row address and the second row address are identical to each other.

10. The semiconductor device of claim 9, wherein, when the first comparison signal is received to the read operation determination unit, the read operation determination unit outputs the operation signal so that the first sub-read operation on the selected page is performed by the second row address, and when the second comparison signal is received to the read operation determination unit, the read operation determination unit outputs the operation signal so that the second sub-read operation on the selected page is performed by the second row address.

11. The semiconductor device of claim 8, wherein, after performing the LSB read operation on the selected page in the first sub-read operation, the read operation control unit stores read LSB data, and controls the peripheral circuit to output the stored LSB data or perform an MSB read operation according to the stored LSB data.

12. The semiconductor device of claim 11, wherein the read operation control unit determines whether the selected page is a page on which the LSB program operation is performed or a page on which an MSB program operation is performed according to the program state data of the stored LSB data.

13. The semiconductor device of claim 8, wherein, in the second sub-read operation, the read operation control unit determines whether the selected page is a page on which an LSB program operation is performed or a page on which the MSB program operation is performed according to the program state data stored during the first sub-read operation, and controls the peripheral circuit to output LSB data read by performing the LSB read operation on the selected page when it is determined that the selected page is the page on which the LSB program operation is performed and to output MSB data read by performing an MSB read operation on the selected page when it is determined that the selected page is the page on which the MSB program operation is performed.

14. A semiconductor device, comprising:
a register configured to store one or more row addresses;
an address comparator configured to compare a memory block address and a page address included in each of a first row address and the one or more addresses stored in the register, and output a first comparison signal or a second comparison signal based on the comparison, the first comparison signal indicating that there is no matching address from among the one or more row addresses that is identical to the first row address, the second comparison signal indicating that there is a matching address from among the one or more row addresses that is identical to the first row address; and
a peripheral circuit configured to perform a first sub-read operation on a selected page corresponding to the first row address based on the first comparison signal, the first sub-read operation comprising reading a program state data programmed in the page and storing the program state data in the register, and configured to perform a second sub-read operation on the selected page corresponding to the first row address based on the second comparison signal and the program state data stored in the register,
wherein the second sub-read operation comprises an MSB read operation on the selected page corresponding to the first row address when the program state data stored in the register indicates an MSB program operation is performed on the selected page.

15. The semiconductor device of claim 14, wherein the second sub-read operation comprises an LSB read operation when the program state data stored in the register indicates an LSB program operation is performed on the selected page.

* * * * *